United States Patent
Jeon et al.

(10) Patent No.: US 9,231,093 B2
(45) Date of Patent: Jan. 5, 2016

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Woo-chul Jeon, Daegu (KR); Kyoung-yeon Kim, Seongnam-si (KR); Jong-seob Kim, Hwaseong-si (KR); Joon-yong Kim, Seoul (KR); Ki-yeol Park, Suwon-si (KR); Young-hwan Park, Seoul (KR); Jai-kwang Shin, Anyang-si (KR); Jae-joon Oh, Seongnam-si (KR); Hyuk-soon Choi, Hwaseong-si (KR); Jong-bong Ha, Yongin-si (KR); Sun-kyu Hwang, Seoul (KR); In-jun Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/804,188

(22) Filed: Mar. 14, 2013

(65) Prior Publication Data

US 2014/0021511 A1     Jan. 23, 2014

(30) Foreign Application Priority Data

Jul. 20, 2012   (KR) .................. 10-2012-0079588

(51) Int. Cl.
  *H01L 29/778*   (2006.01)
  *H01L 29/66*    (2006.01)
  (Continued)

(52) U.S. Cl.
  CPC ........ *H01L 29/778* (2013.01); *H01L 29/66431* (2013.01); *H01L 29/66462* (2013.01);
  (Continued)

(58) Field of Classification Search
  CPC ................. H01L 29/2003; H01L 29/42316; H01L 29/7787; H01L 29/402; H01L 29/7832; H01L 29/0619; H01L 29/66462; H01L 29/7786; H01L 29/4236; H01L 29/66886; H01L 29/778; H01L 29/7781; H01L 29/8124; H01L 29/8128; H01L 21/28575; H01L 27/0605
  USPC .......... 257/192, 194, 195, E29.246, E29.127, 257/E21.172, E21.403, E21.407, E29.253; 438/172
  See application file for complete search history.

(56) References Cited

U.S. PATENT DOCUMENTS 6,236,070 B1 *   5/2001   Griffin et al. ................. 257/192
6,465,814 B2 *  10/2002   Kasahara et al. ............. 257/192

(Continued)

FOREIGN PATENT DOCUMENTS

JP   2010074047 A   4/2010
JP   2011187953 A   9/2011

(Continued)

*Primary Examiner* — Marvin Payen
*Assistant Examiner* — Victor Barzykin
(74) *Attorney, Agent, or Firm* — Harness, Dickey & Pierce, P.L.C.

(57) ABSTRACT

A high electron mobility transistor (HEMT) according to example embodiments includes a channel layer, a channel supply layer on the channel layer, a source electrode and a drain electrode on at least one of the channel layer and the channel supply layer, a gate electrode between the source electrode and the drain electrode, and a Schottky electrode forming a Schottky contact with the channel supply layer. An upper surface of the channel supply layer may define a Schottky electrode accommodation unit. At least part of the Schottky electrode may be in the Schottky electrode accommodation unit. The Schottky electrode is electrically connected to the source electrode.

26 Claims, 8 Drawing Sheets

(51) Int. Cl.
  *H01L 29/872* (2006.01)
  *H01L 29/40* (2006.01)
  *H01L 29/417* (2006.01)
  *H01L 29/423* (2006.01)
  *H01L 29/47* (2006.01)
  *H01L 29/10* (2006.01)
  *H01L 29/20* (2006.01)

(52) U.S. Cl.
  CPC .......... *H01L29/7786* (2013.01); *H01L 29/872* (2013.01); *H01L 29/1066* (2013.01); *H01L 29/2003* (2013.01); *H01L 29/402* (2013.01); *H01L 29/41766* (2013.01); *H01L 29/4236* (2013.01); *H01L 29/475* (2013.01)

(56) References Cited

U.S. PATENT DOCUMENTS

| | | | |
|---|---|---|---|
| 6,878,962 | B1 | 4/2005 | Kawasaki et al. |
| 7,498,617 | B2 | 3/2009 | Kinzer |
| 7,759,760 | B2 | 7/2010 | Yafune et al. |
| 8,198,653 | B2 * | 6/2012 | Imada et al. ............. 257/194 |
| 2003/0173584 | A1 * | 9/2003 | Nikaido ................... 257/194 |
| 2005/0189561 | A1 * | 9/2005 | Kinzer et al. ............ 257/192 |
| 2006/0060871 | A1 * | 3/2006 | Beach ....................... 257/94 |
| 2007/0102727 | A1 * | 5/2007 | Twynam ................... 257/194 |
| 2008/0179694 | A1 * | 7/2008 | Nakazawa et al. ........ 257/402 |
| 2009/0146185 | A1 * | 6/2009 | Suh et al. ................. 257/194 |
| 2009/0321817 | A1 | 12/2009 | Hunt |
| 2010/0155781 | A1 * | 6/2010 | Suzuki et al. ............ 257/195 |
| 2010/0163928 | A1 * | 7/2010 | Imada et al. ............. 257/194 |
| 2011/0254056 | A1 * | 10/2011 | Machida et al. .......... 257/195 |
| 2012/0080687 | A1 * | 4/2012 | Kuraguchi ................. 257/76 |
| 2012/0139008 | A1 * | 6/2012 | Imada et al. ............. 257/194 |
| 2013/0292699 | A1 * | 11/2013 | Ueno et al. ................ 257/76 |

FOREIGN PATENT DOCUMENTS

| | | | |
|---|---|---|---|
| JP | 2011233695 A | | 11/2011 |
| JP | 2011243978 A | * | 12/2011 |
| KR | 20090029897 A | | 3/2009 |
| KR | 20090048035 A | | 5/2009 |
| KR | 20100034921 A | | 4/2010 |
| KR | 20110041550 A | | 4/2011 |

* cited by examiner

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0079588, filed on Jul. 20, 2012, in the Korean Intellectual Property Office, the disclosure of which is incorporated herein in its entirety by reference.

BACKGROUND

1. Field

Example embodiments relate to high electron mobility transistors and/or methods of manufacturing high electron mobility transistors, and more particularly, to high electron mobility transistors capable of flowing electric current forward and backward and/or methods of manufacturing high electron mobility transistors capable of flowing electric current forward and backward.

2. Description of the Related Art

In a power conversion system, an efficiency of the entire system may depend upon an efficiency of a semiconductor switching device. A power metal oxide semiconductor field effect transistor (MOSFET) or an insulated gate bipolar transistor (IGBT) using silicon has been mainly used as a switching device; however, increasing efficiency of the switching device may be limited to due to the characteristics of the silicon itself.

To overcome the limitations of silicon material, research into a high electron mobility transistor (HEMT) is being actively conducted.

A HEMT may include semiconductor layers having different electrical polarization characteristics from each other. A semiconductor layer having a relatively large polarizability in the HEMT may cause two-dimensional electron gas (2DEG) in other semiconductor layers that are hetero-bonded with the semiconductor layer. The 2DEG may be used as a channel between a drain electrode and a source electrode, and an electric current flowing in the channel may be controlled by a bias voltage applied to a gate electrode.

On the other hand, in a field effect semiconductor switching device such as the HEMT, an electric potential of the drain electrode may be lower than that of the source electrode, and accordingly, a reverse direction voltage may be applied to the field effect semiconductor switching device. To address this problem, a freewheeling diode may be connected to the field effect semiconductor device in parallel.

However, as described above, if the freewheeling diode is connected to the semiconductor device as an additional device, an additional process for fabricating the freewheeling diode may be necessary. Moreover, a size of the semiconductor switching device may increase, and fabrication costs may also increase.

SUMMARY

Example embodiments relate to single high electron mobility transistors functioning as field effect semiconductor devices and freewheeling diodes.

Example embodiments relate to high electron mobility transistors capable of reducing a turn-on voltage of freewheeling diodes.

Example embodiments relate to methods of manufacturing high electron mobility transistors.

Additional aspects will be set forth in part in the description that follows and, in part, will be apparent from the description, or may be learned by practice of example embodiments.

According to example embodiments, a high electron mobility transistor (HEMT) includes: a channel layer; a channel supply layer formed on the channel layer; a source electrode and a drain electrode formed on at least one of the channel layer and the channel supply layer; a gate electrode disposed between the source electrode and the drain electrode; and a Schottky electrode that forms a Schottky contact with the channel supply layer. An upper surface of the channel supply layer defines a Schottky electrode accommodation unit, and the Schottky electrode accommodation unit of the channel supply layer may be between the gate electrode and the drain electrode. The Schottky electrode is electrically connected to the source electrode. At least part of the Schottky electrode is in the Schottky electrode accommodation unit.

In example embodiments, the Schottky electrode accommodation unit may be a recess defined by the upper surface of the channel supply layer. The Schottky electrode accommodation unit may be a recess that is depressed toward the channel layer.

In example embodiments, the Schottky electrode accommodation unit may be separated from an interface between the channel layer and the channel supply layer.

In example embodiments, a distance from a bottom portion of the Schottky electrode accommodation unit to the interface between the channel layer and the channel supply layer may be maintained at a level at which a concentration of a two-dimensional electron gas (2DEG) formed in the channel layer below the Schottky electrode is about 90% or greater than a concentration of the 2DEG formed in an adjacent region of the channel layer.

In example embodiments, the distance from the bottom portion of the Schottky electrode accommodation unit to the interface between the channel layer and the channel supply layer may be about 6 nm or greater.

In example embodiments, the Schottky electrode accommodation unit may be discontinuously formed along a width direction of the channel layer. A plurality of the Schottky electrode accommodation units may be formed and arranged along the width direction of channel layer, and the plurality of Schottky electrode accommodation units may be spaced apart from each other.

In example embodiments, the Schottky electrode accommodation unit may be continuously formed along a width direction of the channel layer.

In example embodiments, the Schottky electrode may include: a first electrode layer on the channel supply layer; and a second electrode layer contacting the first electrode layer. A work function of the second electrode layer may be greater than a work function of the first electrode layer.

In example embodiments, at least a part of the second electrode layer may be in the Schottky electrode accommodation unit.

In example embodiments, the upper surface of the channel supply layer may further define a gate electrode accommodation unit between the source electrode and the Schottky electrode.

In example embodiments, the gate electrode accommodation unit may a recess defined by the upper surface of the channel supply layer. The gate electrode accommodation unit may be a recess that is depressed toward the channel layer.

In example embodiments, the gate electrode accommodation unit may expose the interface between the channel layer and the channel supply layer, or the gate electrode accommodation unit may expose a portion of the channel layer that is lower than the interface between the channel layer and the channel supply layer.

In example embodiments, an insulating layer may be between the gate electrode accommodation unit and the gate electrode.

In example embodiments, a depletion forming layer may be between the gate electrode and the channel layer.

In example embodiments, the depletion forming layer may be a p-type semiconductor layer.

In example embodiments, a first pad may contact the source electrode and the Schottky electrode, and a second pad may contact the drain electrode.

In example embodiments, the first pad may further include a field plate over the Schottky electrode.

In example embodiments, a passivation layer may be between the gate electrode and the first pad.

According to example embodiments, a method of manufacturing a high electron mobility transistor (HEMT), includes: forming a channel layer; forming a channel supply layer on the channel layer; forming a Schottky electrode accommodation unit in the channel supply layer; forming a source electrode and a drain electrode on at least one of the channel layer and the channel supply layer; forming a gate electrode between the source electrode and the drain electrode; and forming at least a part of a Schottky electrode in the Schottky electrode accommodation unit. The Schottky electrode accommodation unit may be defined by an upper surface of the channel supply layer.

In example embodiments, the Schottky electrode accommodation unit may be separated from an interface between the channel layer and the channel supply layer.

In example embodiments, the forming the channel supply layer may include forming a gate electrode accommodation unit in the channel supply layer between the source electrode and the drain electrode. The gate electrode accommodation unit may be defined by the upper surface of the channel supply layer.

In example embodiments, the method may further include forming an insulating layer on the gate electrode accommodation layer before forming the gate electrode.

In example embodiments, the method may further include forming a depletion forming layer on the channel supply layer before forming the gate electrode.

In example embodiments, the method may further include forming a first pad contacting the source electrode and the Schottky electrode, and forming a second pad contacting the drain electrode.

In example embodiments, the first pad may include a field plate over the Schottky electrode.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating principles of example embodiments. In the drawings.

DETAILED DESCRIPTION

Figure 1:
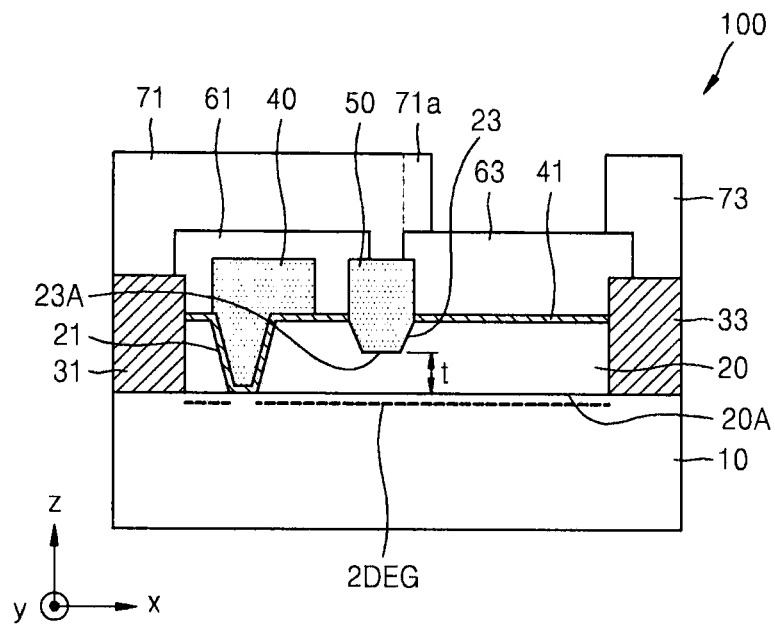
FIG. 1 is a schematic cross-sectional view of a high electron mobility transistor (HEMT) according to example embodiments.

Example embodiments will not be described more fully with reference to the accompanying drawings, in which some example embodiments are shown. Example embodiments may, however, be embodiments in many different forms and should not be construed as being limited to the embodiments set forth herein; rather, these example embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a high electron mobility transistor (HEMT) 100 according to example embodiments.

Referring to FIG. 1, a HEMT 100 according to example embodiments includes a channel layer 10, a channel supply layer 20 formed on the channel layer 10, a source electrode 31 and a drain electrode 33 formed on the channel layer 10, a gate electrode 40 disposed between the source electrode 31 and the drain electrode 33, and a Schottky electrode 50 that makes a Schottky contact with the channel supply layer 20. In other words, the source electrode 31, gate electrode 40, and drain electrode 33 may be considered a first electrode, a second electrode, and a third electrode respectively that are spaced apart from each other on at least one of the channel layer and the channel supply layer. The Schottky electrode 50 may be spaced apart from the gate electrode 40 and the drain electrode 33.

The channel layer 10 is a layer for forming a channel between the source electrode 31 and the drain electrode 33, and may be a semiconductor layer. For example, the channel layer 10 may include a group III-V semiconductor. For example, the channel layer 10 may include at least one of GaN, InGaN, and AlGaN. However, example embodiments are not limited thereto, and the channel layer 10 may be formed of another material, provided that a two-dimensional electron gas (2DEG) may be formed therein. The channel layer 10 may be undoped, or alternatively, the channel layer may be doped with impurities. A thickness of the channel layer 10 may be tens of nm or less, for example, about 10 nm or less. However, the thickness of the channel layer 10 is not limited thereto and may vary.

The channel supply layer 20 may be disposed on the channel layer 10. The channel supply layer 20 may include a material (e.g., semiconductor), of which at least one of a polarization characteristic, an energy bandgap, and a lattice constant is different from that of the channel layer 10. For example, the channel supply layer 20 may include a material (e.g., group III-V semiconductor) having a polarizability and/or an energy bandgap that are greater than those of the channel layer 10. The channel supply layer 20 may have a single or multi-layered structure including one or more nitrides that include at least one of Al, Ga, In, and B. For example, the channel supply layer 20 may have a single or multi-layered structure including at least one of AlGaN, AlInN, InGaN, AlN, and AlInGaN. The channel supply layer 20 may be undoped; however, the channel supply layer 20 may be doped with desired (and/or alternatively predetermined) impurities. A thickness of the channel supply layer 20 may be tens of nm or less, for example, about 30 nm or less. However, the thickness of the channel supply layer 20 is not limited thereto and may vary.

A 2DEG may be formed in a part of the channel layer 10. The 2DEG may be formed in a region of the channel layer 10 under an interface 20A between the channel layer 10 and the channel supply layer 20.

The 2DEG formed in the channel layer 10 may be used as a current path, e.g., a channel, between the source electrode 31 and the drain electrode 33. The source electrode 31 and the drain electrode 33 may be arranged in various configurations, in which the 2DEG may be used as a channel. For example, as shown in FIG. 1, the channel supply layer 20 may be etched to form a region 31A (refer to FIG. 8B) on which the source electrode 31 will be formed and a region 33A (refer to FIG. 8B) on which the drain electrode 33 will be formed, and then, the source electrode 31 and the drain electrode 33 may be formed on corresponding regions 31A and 33A. As another example, although not shown in the drawings, the source electrode 31 and the drain electrode 33 may be formed on the channel supply layer 20, or the channel supply layer 20 may be etched to a desired (and/or alternatively predetermined) depth and the source and the drain electrodes 31 and 33 may be formed on the etched region. The source electrode 31 and the drain electrode 33 may make ohmic contact with the channel layer 10 or the channel supply layer 20. Alternatively, although not shown, the source 31 electrode and drain electrode 33 may be formed at different heights on at least one of the channel layer 10, channel supply layer 20, and an etched portion to a desired (and/or alternatively predetermined) depth of the channel supply layer 20. For example, one of the source electrode 31 and the drain electrode 33 may be formed on the channel layer 10 or a portion of the channel supply layer 20 that is etched to a desired (and/or alternatively predetermined) depth, while the other of the source electrode 31 and the drain electrode may be formed on the channel supply layer 20.

The gate electrode 40 controls an electric current flowing between the source electrode 31 and the drain electrode 33. The source and drain electrodes 31 and 33 are separated from each other, and the gate electrode 40 may be disposed between the source electrode 31 and the drain electrode 33.

The gate electrode 40 may form a Schottky contact with the channel supply layer 20. In this case, the gate electrode 40 may be formed of a material forming a Schottky contact with the channel supply layer 20 (for example, metal, metal compound, or metal oxide). However, in some cases, the Schottky contact between the gate electrode 40 and the channel supply layer 20 may not be formed.

The gate electrode 40 may have a normally-off structure. The normally-off structure is a structure that is in a turned-off state when a voltage is not applied to the gate electrode 40, that is, in a normal state, and in a turned-on state when a voltage is applied to the gate electrode 40.

As an example of the normally-off structure, the gate electrode 40 may be accommodated in the gate electrode accommodation unit 21 formed between the source electrode 31 and the Schottky electrode 50 on the channel supply layer 20. Here, the gate electrode accommodation unit 21 may be formed as a recess in the channel supply layer 20 towards the channel layer 10. The gate electrode 40 may be accommodated in the gate electrode accommodation unit 21. The gate electrode accommodation unit 21 may be formed by etching the channel supply layer 20. The gate electrode accommodation unit 21 may be formed by etching down to the interface 20A between the channel layer 10 and the channel supply layer 20, or down to a lower depth than the interface 20A, that is, down to a portion where the gate electrode accommodation unit 21 may be apart from the interface 20A. In other words, the gate electrode accommodation unit 21 may be a recess defined by the upper surface of the channel supply layer 20, and the gate electrode accommodation unit 21 may be depressed toward the channel layer 10. The gate electrode accommodation unit 21 may expose the interface between the channel layer 10 and the channel supply layer 20. Alternatively, although not shown, the gate electrode accommodation unit 21 may expose a portion of the channel layer 10 that is below the interface between the channel layer 10 and the channel supply layer 20.

On the region corresponding to the gate electrode 40, the 2DEG may not be formed or different characteristics (electron concentration, or the like) from the other region may be shown. Accordingly, when a voltage is not applied to the gate electrode 40 formed in the gate electrode accommodation unit 21, the 2DEG is not formed under the gate electrode 40, as shown in FIG. 1, and thus, the gate electrode 40 may be in the turned-off state.

An insulating layer 41 for limiting (and/or preventing) leakage current from generating may be disposed between the gate electrode accommodation unit 21 and the gate electrode 40. The insulating layer 41 may be formed along the channel supply layer 20 and the gate electrode accommodation unit 21. The insulating layer 41 may include, for example, at least one of $Al_2O_3$, $SiO_x$, $Si_xN_y$, $Sc_2O_3$, AlN, $Ga_2O_3$, $Gd_2O_3$, $AlxGa_2(1-x)O_3$, MgO, and a combination thereof. Otherwise, an insulating material generally used in a transistor may be used to form the insulating layer 41. When using the insulating layer 41, there is no need to form the Schottky contact between the gate electrode 40 and the channel supply layer 20, the number of materials (conductors) that may be used as the gate electrode 40 may be increased more than that in a case where the Schottky contact is made. Also, the gate electrode 40 may be formed of the same material as the source electrode 31 and the drain electrode 33.

Figure 2:
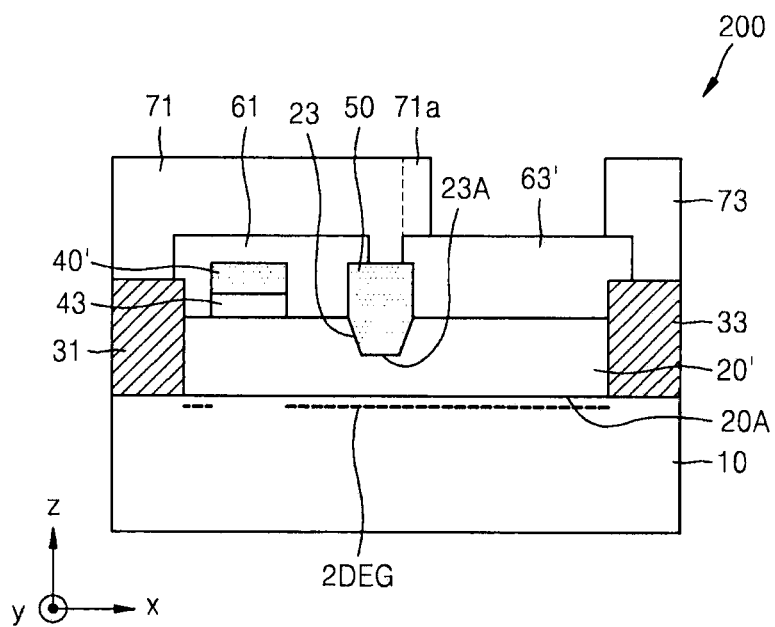
FIG. 2 is a cross-sectional view of a HEMT according to example embodiments.

FIG. 2 is a cross-sectional view of a HEMT 200 according to example embodiments. The HEMT 200 adopts a different gate electrode structure than the HEMT 100 in FIG. 1. Referring to FIG. 2, as another example of the normally-off structure, a depletion forming layer 43 may be disposed between the gate electrode 40' and the channel supply layer 20'. The depletion forming layer 43 may form a depletion region in the 2DEG that is formed in the channel layer 10. An energy bandgap on the channel supply layer 20' under the depletion forming layer 43 may be increased. Thus, a depletion region may be formed in the 2DEG of the channel layer 10, which corresponds to the depletion forming layer 43. Therefore, the 2DEG may not be formed in the region corresponding to the depletion forming layer 43, or characteristics (electron concentration, and the like) that are different from those of the other region may be shown. A passivation layer 63' may be formed on the channel supply layer 20'. Materials for the channel supply layer 20', gate electrode 40', and passivation layer 63' may be the same materials as those in the channel supply layer 20, gate electrode 40, and passivation layer 63, respectively, described with respect to FIG. 1.

The depletion forming layer 43 may be a p-type semiconductor layer. For example, the depletion forming layer 43 may include at least one of GaN, AlGaN, InN, AlInN, InGaN, and AlInGaN, and may be doped with p-type impurities such as Mg. For example, the depletion forming layer 43 may be a p-GaN layer or a p-AlGaN layer.

However, the gate electrode 40' is not limited to a normally-off structure, and may alternatively have a normally-on structure. In the case of a gate electrode having a normally-on structure, in a normal state, a negative voltage less than 0V, for example −5 V, may be applied to the gate electrode 40'.

Referring to FIG. 1 again, the Schottky electrode 50 is disposed between the gate electrode 40 and the drain electrode 33, and may form the Schottky contact with the channel supply layer 20. As such, the electric current flowing from the Schottky electrode 50 toward the drain electrode 33 may sufficiently flow through the 2DEG that has a low resistance and high electron mobility, without being interfered by a depletion layer (not shown) under the gate electrode 40.

The Schottky electrode 50 may include metal or a conductive metal oxide forming the Schottky contact with the channel supply layer 20. For example, the Schottky electrode 50 may include at least one of Ni, Ti, Au, Pt, $CuInO_2$, and indium tin oxide (ITO). These materials are an example, and various conductive materials (metal, metal oxide, etc.) besides these materials may be used to form the Schottky electrode 50.

The Schottky electrode 50 may be electrically connected to the source electrode 31. For example, a first pad 71 connected to the source electrode 31 may extend to the Schottky electrode 50. The Schottky electrode 50 that is electrically connected to the source electrode 31 may function as an anode electrode, and the drain electrode 33 may function as a cathode electrode. Thus, the HEMT 100 may function as a freewheeling diode.

A Schottky electrode accommodation unit 23 may be formed in a portion of the channel supply layer 20, in which the Schottky electrode 50 is disposed, that is, between the gate electrode 40 and the drain electrode 33. At least a part of the Schottky electrode 50 is accommodated in the Schottky electrode accommodation unit 23.

The Schottky electrode accommodation unit 23 may be formed as a recess towards the channel layer 10. Since the Schottky electrode accommodation unit 23 is formed as a recess, a turn-on voltage of the Schottky electrode 50 is reduced, and accordingly, electric power loss may be reduced.

Meanwhile, the Schottky electrode accommodation unit 23 may be separated from the interface 20A between the channel layer 10 and the channel supply layer 20. As such, sharp reduction of the 2DEG, which is caused when the Schottky electrode 50 is close to the interface 20A between the channel layer 10 and the channel supply layer 20 less than a desired (and/or alternatively predetermined) distance, may be limited (and/or prevented).

Figure 3:
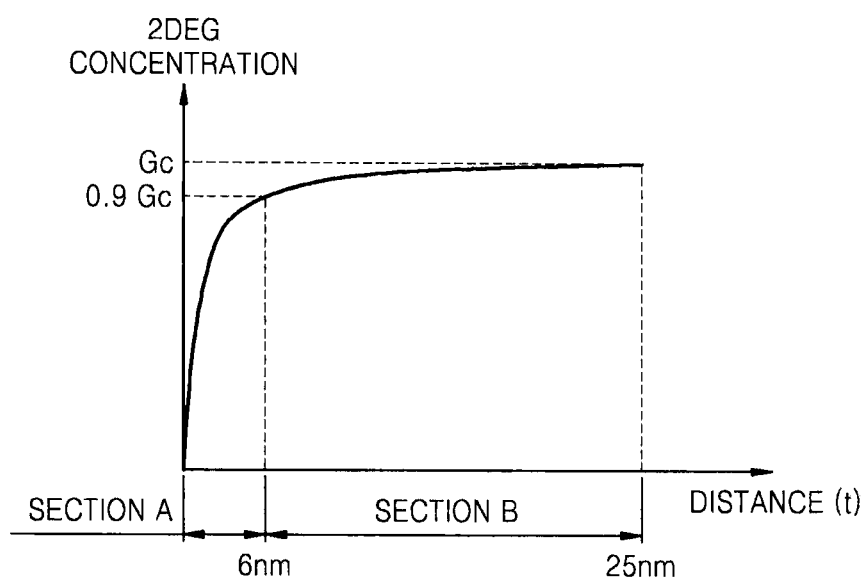
FIG. 3 is a graph showing a two-dimensional electron gas (2DEG) concentration on a lower portion of a Schottky electrode according to a distance from a bottom portion of a Schottky electrode accommodation unit to an interface between a channel layer and a channel supply layer in the HEMT according to example embodiments.

FIG. 3 is a graph showing concentration of the 2DEG formed in the lower portion of the Schottky electrode 50 according to a distance t from a bottom portion 23A of the Schottky electrode accommodation unit 23A to the interface 20A between the channel layer 10 and the channel supply layer 20 in the HEMT 100 according to example embodiments.

Referring to FIG. 3, when the distance t between the bottom portion 23A of the Schottky electrode accommodation unit 23 to the interface 20A between the channel layer 10 and the channel supply layer 20 is reduced, the concentration of the 2DEG formed under the Schottky electrode 50 is reduced. In more detail, in a section (section B) in which the distance t from the bottom portion 23A of the Schottky electrode accommodation unit 23 to the interface 20A between the channel layer 10 and the channel supply layer 20 is reduced to a desired (and/or alternatively predetermined) distance, the concentration of the 2DEG formed under the Schottky electrode 50 is gradually reduced. However, in a section (section A) in which the distance t is reduced less than a desired (and/or alternatively predetermined) distance, the concentration of the 2DEG formed under the Schottky electrode 50 is sharply reduced. Since the concentration of the 2DEG is sharply reduced, a power consumption amount increases greatly. Specifically, the concentration of the 2DEG formed under the Schottky electrode 50 is slowly reduced to 90% of the concentration (Gc) of the 2DEG formed under the adjacent channel supply layer 20, and then, is sharply reduced from 90%. Here, the adjacent channel supply layer 20 denotes the channel supply layer 20 in which the Schottky electrode accommodation unit 23 is not formed. The distance t from the bottom portion 23A of the Schottky electrode accommodation unit 23 to the interface 20A between the channel layer 10 and the channel supply layer 20 may be set as a level for maintaining the concentration of the 2DEG formed under the Schottky electrode 50 to be 90% of the concentration Gc of the 2DEG formed in the adjacent region or greater. As such, the 2DEG reduction amount may be minimized while reducing the turn-on voltage, thereby minimizing the power consumption amount of the HEMT 100. As an example for maintaining the concentration of the 2DEG formed under the Schottky electrode 50 to be 90% of the concentration Gc of the 2DEG of adjacent region or greater, when the channel supply layer 20 is an $Al_{0.25}GaN$ layer, the distance t from the bottom portion 23A of the Schottky electrode accommodation unit 23 to the interface 20A between the channel layer 10 and the channel supply layer 20 may be 6 nm or greater. However, the distance t for maintaining the concentration of the 2DEG formed under the Schottky electrode 50 to be 90% of the 2DEG formed in the adjacent region is not limited thereto, and may vary depending on materials forming the channel supply layer 20 and a composition ratio thereof. If the Schottky electrode accommodation unit 23 is a recess form depressed toward the channel layer 10, the distance t from the bottom portion 23A of the Schottky electrode accommodation unit 23 to the interface 20A between the channel layer 10 and the channel supply layer 20 may be less than the thickness of the channel supply layer 20.

Referring back to FIG. 1, the first pad 71 may contact the source electrode 31 and the Schottky electrode 50. As such, the same bias voltage may be applied to the source electrode 31 and the Schottky electrode 50. The second pad 73 may contact the drain electrode 33.

The first pad 71 may further include a field plate 71a of the Schottky electrode 50. Thus, an electric field concentrated on the Schottky electrode 50 may be dispersed, and accordingly, a breakdown voltage may be increased.

A passivation layer 61 may be formed between the first pad 71 and the gate electrode 40. The passivation layer 61 protects the gate electrode 40, and at the same time, limits (and/or prevents) the gate electrode 40 from electrically contacting the source electrode 31, the Schottky electrode 50, and the first pad 71.

Figure 4:
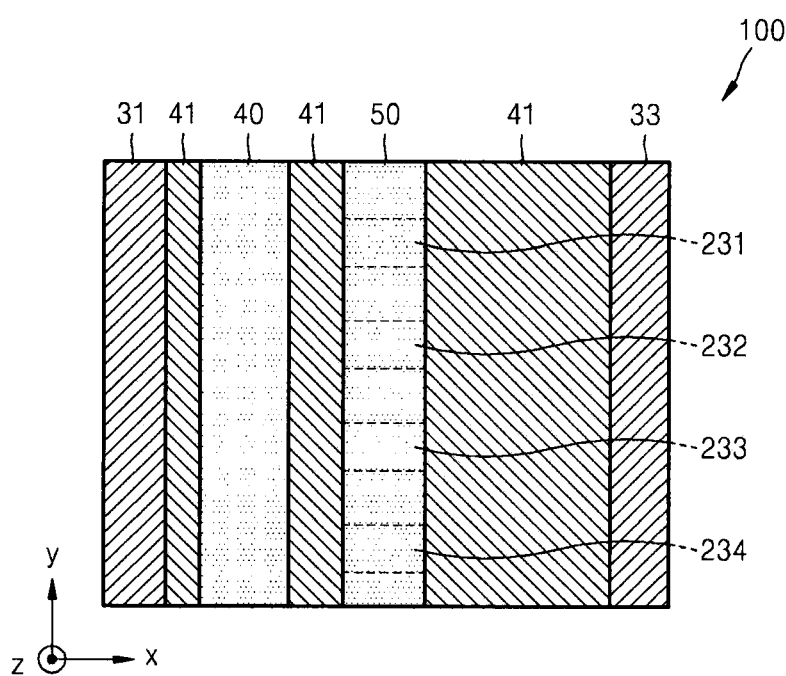
FIG. 4 is a plan view of the HEMT of FIG. 1.

FIG. 4 is a plan view of the HEMT 100, and the Schottky electrode accommodation unit 23 will be described with reference to FIG. 4. Here, the passivation layer 61 and the first and second pads 71 and 73 of FIG. 1 are not shown for convenience of description.

Referring to FIG. 4, the Schottky electrode accommodation unit 23 may be discontinuously formed along a width direction (y-axis direction) of the channel layer 10. For example, a plurality of Schottky electrode accommodation units 231, 232, 233, and 234 may be disposed along the width direction (y-axis direction) of the channel layer 10 to be spaced apart from each other. Thus, when the HEMT 100 operates forward, a turn-on voltage is reduced by the Schottky electrode 50 formed on the Schottky electrode accommodation units 231, 232, 233, and 234, and at the same time, when the HEMT 100 operates backward, a backward leakage current may be reduced by using the Schottky electrode 50 formed on the regions other than the Schottky electrode accommodation units 231, 232, 233, and 234. Here, the width direction (y-axis direction) of the channel layer 10 is a direction perpendicular to the length direction (x-axis direction) of the channel layer 10 in which the channel is formed between the source electrode 31 and the drain electrode 33.

Figure 5:
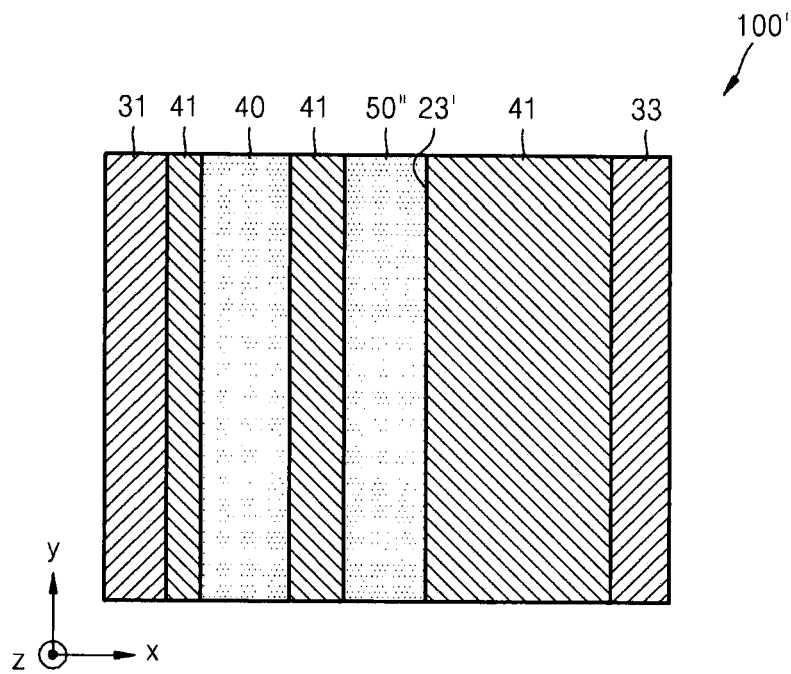
FIG. 5 is a plan view of a HEMT according to example embodiments.

However, the arrangement of the Schottky electrode accommodation unit 23 is not limited thereto. For example, as shown in FIG. 5, a HEMT 100' according to example embodiments may include Schottky electrode 50" formed in a Schottky electrode accommodation unit 23' that is continuously formed along the width direction (y-axis direction) of the channel layer 10.

Figure 6:
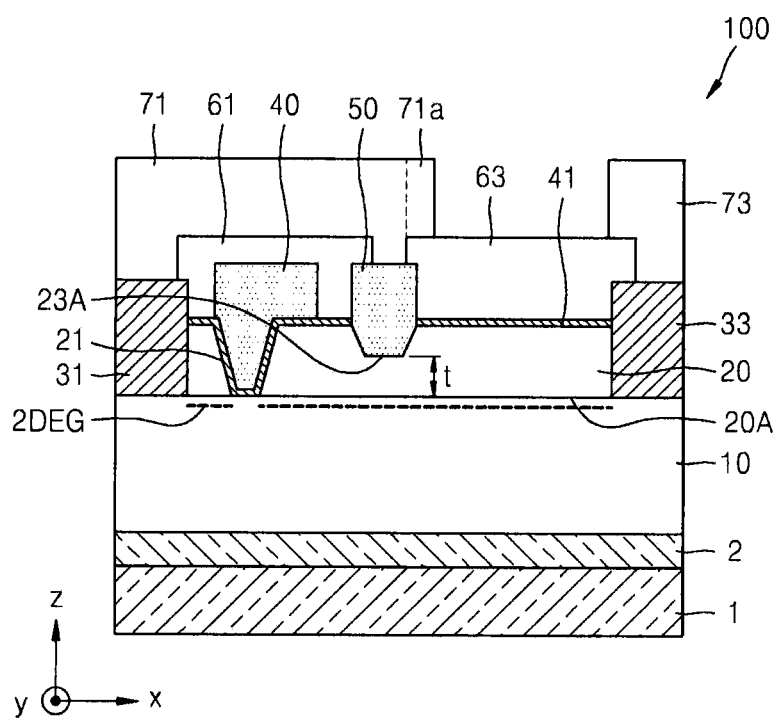
FIG. 6 is a cross-sectional view showing the HEMT of FIG. 1 further including a substrate and a buffer layer.

FIG. 6 is the HEMT 100 further including a substrate 1 and a buffer layer 2, in addition to the HEMT 100 shown in FIG. 1. The buffer layer 2 may be further disposed on the substrate 1. The substrate 1 may be formed of, for example, sapphire, Si, SiC, or GaN. The buffer layer 2 may be formed in order to reduce differences between lattice constants and thermal expansion coefficients of the substrate 1 and the channel layer 10 so as to limit (and/or prevent) the deterioration of crystallinity of the channel layer 10. The buffer layer 2 may have a single or multi-layered structure including one or more selected from nitride materials including at least one of Al, Ga, In, and B. Specifically, the buffer layer 2 may have a single or multi-layered structure including at least one selected from the group consisting of AlN, GaN, AlGaN, InGaN, AlInN, and AlGaInN. In some cases, a desired (and/or alternatively predetermined) seed layer (not shown) may be further disposed between the substrate 1 and the buffer layer 2. The seed layer may be a base layer for growing the buffer layer 2. The substrate 1 and the buffer layer 2 may be removed after manufacturing the HEMT 100. That is, the substrate 1 and the buffer layer 2 may be selectively included in the HEMT 100. Although not shown, the substrate 1 and the buffer layer 2 may also be included to support HEMTs other than the HEMT 100 in FIG. 1, for example the HEMTs according to example embodiments in FIGS. 2, 7, and 9.

Figure 7:
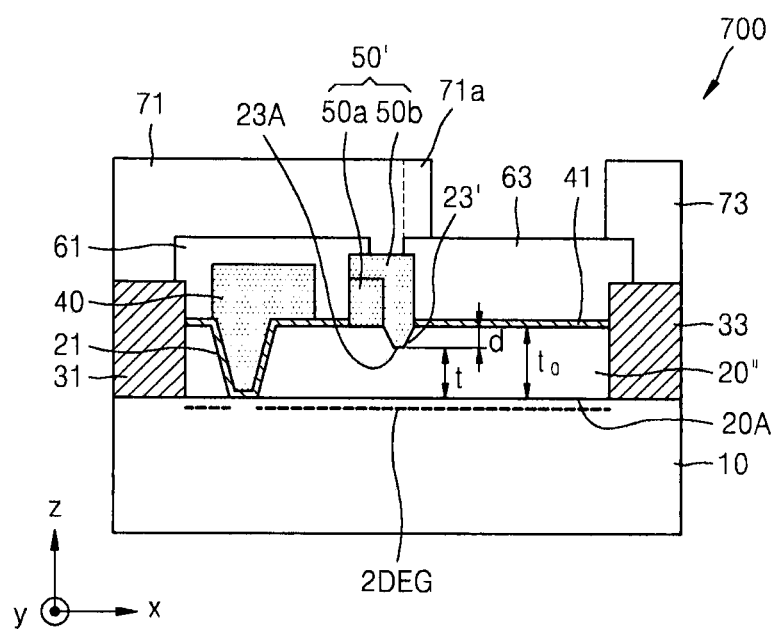
FIG. 7 is a cross-sectional view of a HEMT according to example embodiments.

FIG. 7 is a cross-sectional view of a HEMT 700 according to example embodiments.

The HEMT 700 includes the channel layer 10, the channel supply layer 20", the source electrode 31, the drain electrode 33, and the Schottky electrode 50'. The Schottky electrode 50' may have multiple layers having different Schottky barriers from each other. The same reference numerals denote the same elements as those described in FIG. 1, and descriptions thereof are not provided.

For example, the Schottky electrode 50' may include Ni/Ti, Ni/Au, CuInO$_2$/Au, ITO/Au, Ni/Pt/Au, or Pt/Au.

A part of at least one of the plurality of layers included in the Schottky electrode 50' may be accommodated in the Schottky electrode accommodation unit 23'. For example, the Schottky electrode 50' may include a first electrode layer 50$a$ having a less work function, for example, a Ti layer, and a second electrode layer 50$b$ having a larger work function, for example, an Ni layer on the first electrode layer 50$a$, wherein a part of the second electrode layer 50$b$ having the larger work function may be accommodated in the Schottky electrode accommodation unit 23'. Since a part of the second electrode layer 50$b$ having the larger work function is accommodated in the Schottky electrode accommodation unit 23', a turn-on voltage of the Schottky electrode 50' may be reduced.

A depth d of the Schottky electrode accommodation unit 23' is about 20% of a thickness t0 of the channel supply layer 20 or less. For example, when the channel supply layer 20" is an AlGaN layer having the thickness t0 of about 25 to 30 nm, the depth d of the Schottky electrode accommodation unit 23' may be about 5 nm. As described above, by restricting the depth d of the Schottky electrode accommodation unit 23', a backward leakage current that may be generated when the second electrode layer 50$b$ of the Schottky electrode 50' is accommodated in the Schottky electrode accommodation unit 23' may be reduced.

FIGS. 8A through 8H are cross-sectional views illustrating processes of manufacturing the HEMT 100 of FIG. 1.

Figure 8A:
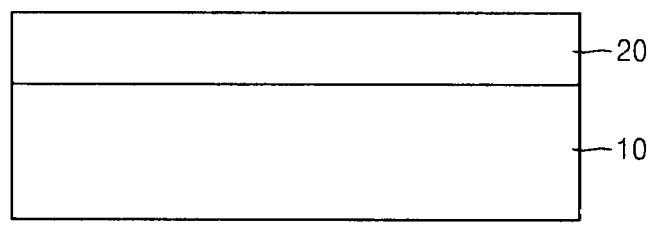
FIGS. 8A through 8H are cross-sectional views illustrating a method of manufacturing the HEMT of FIG. 1, according to example embodiments.

Referring to FIG. 8A, the channel supply layer 20 may be formed on the channel layer 10. The channel supply layer 20 may be formed of semiconductor that is different from that of the channel layer 10. In order to form the channel supply layer 20 on the channel layer 10, an epitaxial growth method may be used. The channel supply layer 20 may be formed of a material (semiconductor) having a polarization characteristic, an energy bandgap, and a lattice constant, at least one of which is different from that of the channel layer 10. For example, the channel supply layer 20 may be formed of a material (semiconductor) having greater polarizability and/or energy bandgap than those of the channel layer 10. That is, the channel layer 20 may be formed as a single or multi-layered structure including one or more selected from the nitride materials including at least one of Al, Ga, In, and B. For example, the channel supply layer 20 may be formed to have a single or multi-layered structure including at least one of various materials including AlGaN, AlInN, InGaN, AlN, or AlInGaN. The channel supply layer 20 may be an undoped layer, or may be doped with desired (and/or alternatively predetermined) impurities if necessary.

Figure 8B:
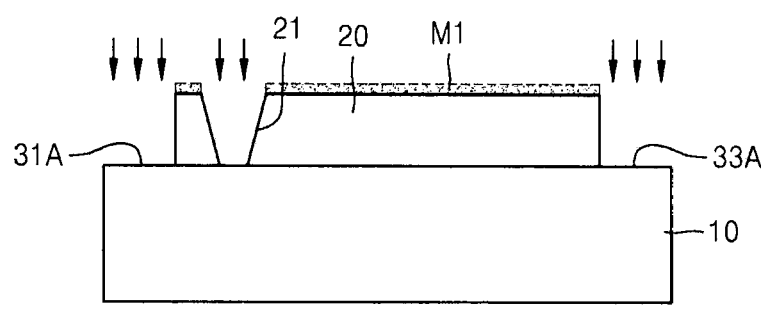

Referring to FIG. 8B, an exposed region of the channel supply layer 20 may be etched to a desired (and/or alternatively predetermined) depth by using a first mask layer M1 as an etching mask. Thus, regions 31A, 33A, and 21 on which the source electrode 31, the drain electrode 33, and the gate electrode 40 will be formed may be formed. As an example, the region 31A on which the source electrode 31 will be formed, the region 33A on which the drain electrode 33 will be formed, and the gate electrode accommodation unit 21 may be etched until the channel layer 10 is exposed. However, the etched depth is not limited thereto, but may be reduced or increased according to necessity. The first mask layer M1 may be removed after forming the regions 31A, 33A, and 21 where the source electrode 31, the drain electrode 33, and the gate electrode 40 will be formed.

Figure 8C:
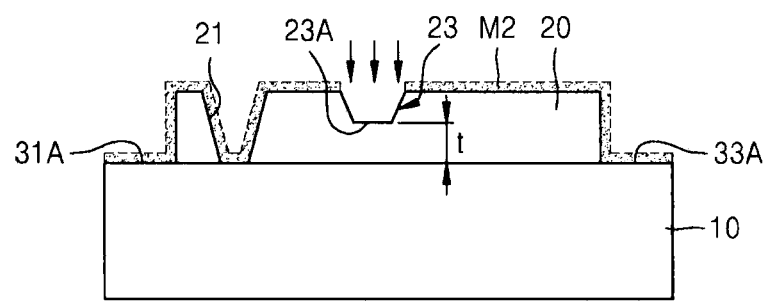

Referring to FIG. 8C, the Schottky electrode accommodation unit 23 may be used by using a second mask layer M2 that is different from the first mask layer M1 as an etching mask. The second mask layer M2 may be used to differentiate an etching depth of the Schottky electrode accommodation unit 23 from that of the gate electrode accommodation unit 21. The channel supply layer 20 may be etched to a depth at which the channel layer 10 is not exposed through the exposed portion of the second mask layer M2, that is, to be separated from the interface 20A between the channel layer 10 and the channel supply layer 20. For example, if the thickness of the channel supply layer 20 is about 20 to 30 nm, the Schottky electrode accommodation unit 23 may be formed so that the distance t from the bottom portion 23A thereof to the interface 20A between the channel layer 10 and the channel supply layer 20 is 6 nm or greater and less than the thickness of the channel supply layer 20. The second mask layer M1 may be removed after forming the Schottky electrode accommodation unit 23.

Figure 8D:
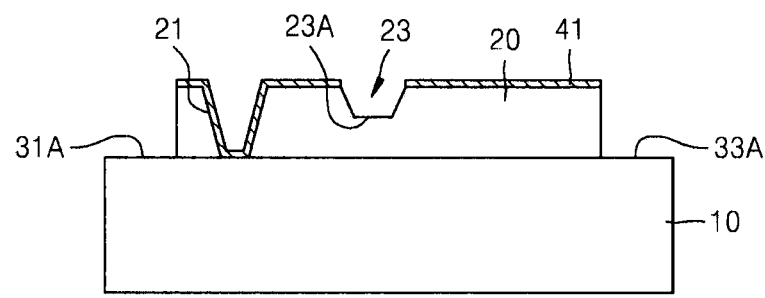

Referring to FIG. 8D, the insulating layer 41 may be formed along with the channel supply layer 20 and the gate electrode accommodation unit 21. Here, the insulating layer 41 may not be formed on the regions 33A and 31A where the drain electrode 33 and the source electrode 31 will be formed and the Schottky electrode accommodation unit 23. The insulating layer 41 may include, for example, at least one of Al$_2$O$_3$, SiOx, SixNy, Sc$_2$O$_3$, AlN, Ga$_2$O$_3$, Gd$_2$O$_3$, AlxGa$_2$(1−x)O$_3$, MgO, and a combination thereof. Otherwise, an insulating material used in a general transistor may be used as the material for forming the insulating layer 41.

Figure 8E:
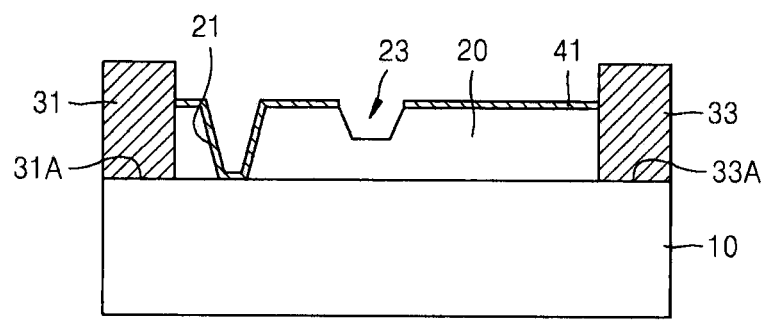

Referring to FIG. 8E, the source electrode 31 and the drain electrode 33 may be formed on the regions 31A and 33A. In example embodiments, the channel supply layer 20 may be etched until the channel layer 10 is exposed in order to form the regions 31A and 33A on which the source electrode 31 and the drain electrode 33 will be formed. However, the above is an example, and the source and drain electrodes 31 and 33 may be formed after etching a partial thickness of the channel supply layer 20 or may be formed on the channel supply layer 20 without performing an etching process. The source and drain electrodes 31 and 33 may be electrically connected to the 2DEG formed in the channel layer 10.

Figure 8F:
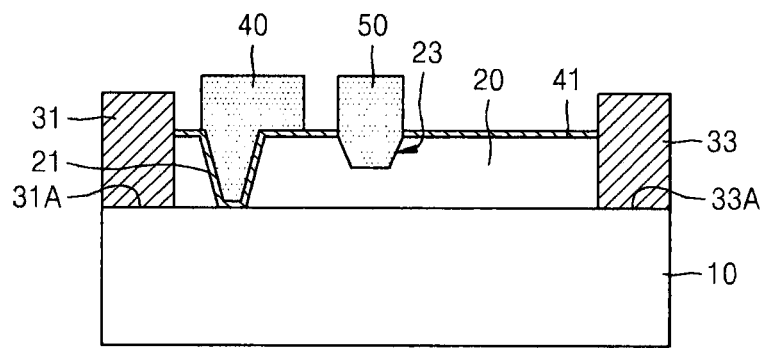

Referring to FIG. 8F, the gate electrode 40 is formed on the gate electrode accommodation unit 21 and the Schottky electrode 50 may be formed on the Schottky electrode accommodation unit 23. Here, the insulating layer 41 is disposed between the gate electrode 40 and the gate electrode accommodation unit 21. The gate electrode 40 may be located closer to the source electrode 31 than to the drain electrode 33. That is, a distance between the source electrode 31 and the gate electrode 40 may be shorter than a distance between the drain electrode 33 and the gate electrode 40. However, the above is an example, and relative distances between the source electrode 31 and the drain electrode 33, and the gate electrode 40 may vary.

Figure 8G:
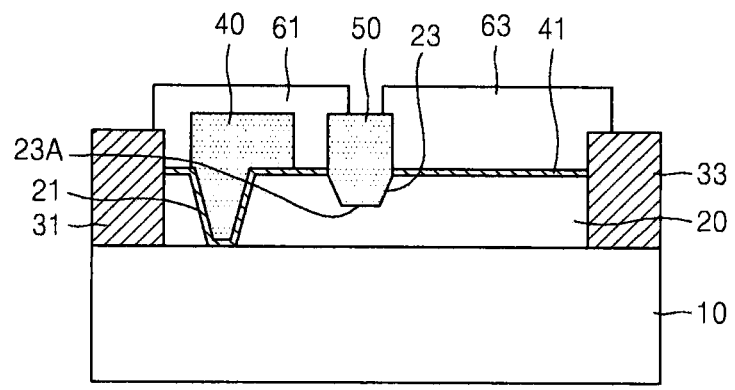

Referring to FIG. 8G, the passivation layer 61 may be formed between the source electrode 31 and the Schottky electrode 50, and a passivation layer 63 may be formed between the Schottky electrode 50 and the drain electrode 33. The passivation layer 61 formed between the source electrode 31 and the Schottky electrode 50 may insulate the gate electrode 40 from the source electrode 31, the Schottky electrode 50, and the first pad 71. Also, the passivation layer 63 formed between the drain electrode 33 and the Schottky electrode 50 may insulate the Schottky electrode 50 from the drain electrode 33 and the second pad 73.

Figure 8H:
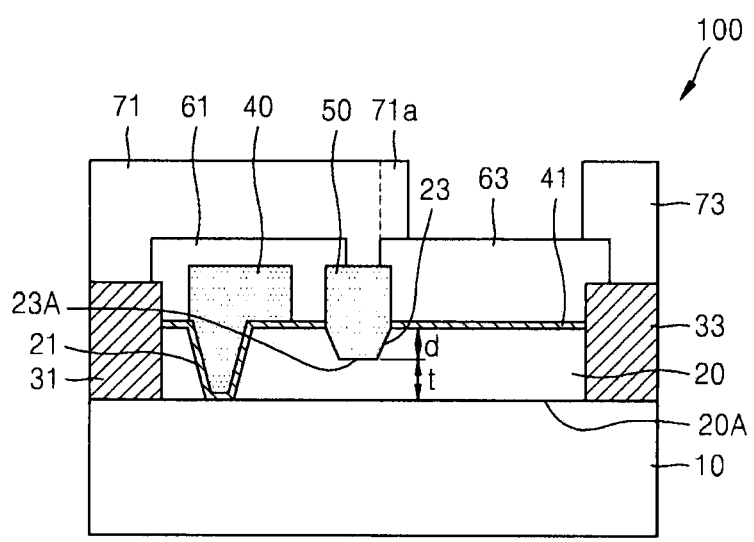

Referring to FIG. 8H, the first pad 71 contacting the source electrode 31 and the Schottky electrode 50 and the second pad 73 contacting the drain electrode 33 may be formed. The first pad 71 may be formed throughout the source electrode 31, the passivation layer 61, and the Schottky electrode 50 in order to commonly contact the source electrode 31 and the Schottky electrode 50. The first pad 71 may further include a field plate 71a extending from the Schottky electrode 50 toward the drain electrode 33.

The manufacturing method described with reference to FIGS. 8A through 8H may be modified variously. For example, the regions 31A and 33A on which the source and drain electrodes 31 and 33 will be formed may be etched in a separate process from that of the Schottky electrode accommodation unit 23; however, the same mask layer as that of the Schottky electrode accommodation unit 23 may be used in a case where the gate electrode accommodation unit 21 or the etching depths of the regions 31A and 33A on which the source electrode 31 and the drain electrode 33 will be formed correspond to the etching depth of the Schottky electrode accommodation unit 23. In addition, configurations and forming methods of the Schottky electrode accommodation unit 23 and the gate electrode accommodation unit 21 may be variously modified. As an example, the Schottky electrode accommodation unit 23 may be formed by forming a protrusion on the channel supply layer 20 without etching a part of the channel supply layer 20. As another example, in order to manufacture the HEMT 200 of FIG. 2, a process of forming the depletion forming layer 43 before forming the gate electrode 40 may be performed instead of the etching process (refer to FIG. 8B) and the insulating layer forming process (refer to FIG. 8D) for forming the gate electrode accommodation unit 21.

Figure 9:
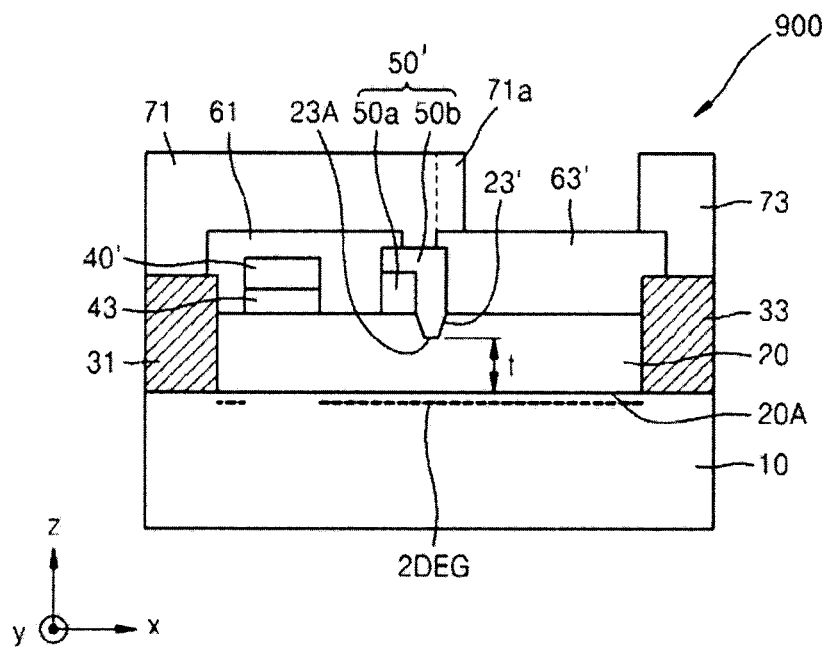
FIG. 9 is a cross-sectional view of a HEMT according to example embodiments.

FIG. 9 is a cross-sectional view of a HEMT 900 according to example embodiments.

Referring to FIG. 9, the HEMT 900 may be the same as the HEMT 200 in FIG. 2, except the HEMT 900 may include the Schottky electrode 50' described previously with respect to FIG. 7.

Figure 10:
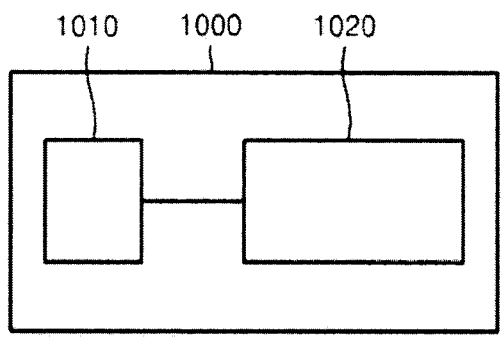
FIG. 10 is a plan view of an IC circuit module according to example embodiments.

FIG. 10 is a plan view of an IC circuit module according to example embodiments.

Referring to FIG. 10, the IC module 1000 may include a HEMT 1010 and a circuit 1020 for controlling the operation of the HEMT 1010. The HEMT 1010 may include one of the HEMTs 100, 200, 700, and 900 according to example embodiments from FIGS. 1-7 and 9.

A HEMT according to example embodiments may be used as, for example, a power device. However, example embodiments are not limited to the power device, that is, a HEMT according to example embodiments may be used as other devices, as well as a power device.

It should be understood that example embodiments described herein should be considered in a descriptive sense only and not for purposes of limitation. Descriptions of features or aspects within each HEMT according to example embodiments should typically be considered as available for other similar features or aspects in other HEMTs according to example embodiments. For example, one of ordinary skill in the art would have known that HEMT 100, 200, 700, or 900 in the drawings may be modified variously. In detail, another material besides the GaN-based material may be used to form the channel layer 10 and the channel supply layer 20. In addition, locations of the channel layer 10 and the channel supply layer 20 may be changed. In addition, the manufacturing method shown in FIGS. 8A through 8H may be variously modified. Moreover, one of ordinary skill in the art would have known that features of HEMTs according to example embodiments may be applied to other semiconductor devices.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
a channel layer;
a channel supply layer on the channel layer,
an upper surface of the channel supply layer defining a Schottky electrode accommodation unit;
a source electrode and a drain electrode on at least one of the channel layer and the channel supply layer;
a gate electrode between the source electrode and the drain electrode such that the Schottky electrode accommodation unit of the channel supply layer is between the gate electrode and the drain electrode; and
at least part of a Schottky electrode in the Schottky electrode accommodation unit of the channel supply layer,
the Schottky electrode forming a Schottky contact with the channel supply layer, and
the Schottky electrode is electrically connected to the source electrode,
the Schottky electrode accommodation unit is a recess defined by the upper surface of the channel supply layer and separated from an interface between the channel layer and the channel supply layer,
a distance from a bottom portion of the Schottky electrode accommodation unit to the interface between the channel layer and the channel supply layer is maintained at a level at which a concentration of a two-dimensional electron gas (2DEG) formed in the channel layer below the Schottky electrode is equal or greater than about 90% of a concentration of the 2DEG formed in an adjacent region of the channel layer and less than about 100% of the concentration of the 2DEG formed in the adjacent region of the channel layer when a voltage is not applied to the Schottky electrode,
the distance from the bottom portion of the Schottky electrode accommodation unit to the interface between the channel layer and the channel supply layer is in a range from a first thickness of the channel supply layer to a second thickness of the channel supply layer,
the first thickness of the channel supply layer corresponds to the level at which the concentration of the 2DEG formed in the channel layer below the Schottky electrode is equal to about 90% of the concentration of the 2DEG formed in the adjacent region of the channel layer, and
the second thickness of the channel supply layer is greater than the first thickness of the channel supply layer and less than a thickness of an other portion of the channel supply layer that is above the adjacent region of the channel layer, and a ratio of the second thickness to the first thickness is about 4.

2. The HEMT of claim 1, wherein the distance from the bottom portion of the Schottky electrode accommodation unit to the interface between the channel layer and the channel supply layer is about 6 nm or greater.

3. The HEMT of claim 1, wherein the Schottky electrode accommodation unit is discontinuously formed along a width direction of the channel layer.

4. The HEMT of claim 3, wherein
a plurality of the Schottky electrode accommodation units are arranged along the width direction of the channel layer, and
the plurality of the Schottky electrode accommodation units are spaced apart from each other.

5. The HEMT of claim 1, wherein the Schottky electrode accommodation unit is continuously formed along a width direction of the channel layer.

6. The HEMT of claim 1, wherein the Schottky electrode includes:
a first electrode layer on the channel supply layer; and
a second electrode layer contacting the first electrode layer, wherein a work function of the second electrode is greater than a work function of the first electrode layer.

7. The HEMT of claim 6, wherein at least a part of the second electrode layer is in the Schottky electrode accommodation unit.

8. The HEMT of claim 1, wherein the upper surface of the channel supply layer further defines a gate electrode accommodation unit between the source electrode and the Schottky electrode.

9. The HEMT of claim 8, wherein
the gate electrode accommodation unit is a recess defined by the upper surface of the channel supply layer.

10. The HEMT of claim 9, wherein
the gate electrode accommodation unit exposes the interface between the channel layer and the channel supply layer, or
the gate electrode accommodation unit exposes a portion of the channel layer that is lower than the interface between the channel layer and the channel supply layer.

11. The HEMT of claim 8, further comprising:
an insulating layer between the gate electrode accommodation unit and the gate electrode.

12. The HEMT of claim 1, further comprising:
a depletion forming layer between the gate electrode and the channel layer.

13. The HEMT of claim 12, wherein the depletion forming layer is a p-type semiconductor layer.

14. The HEMT of claim 1, further comprising:
a first pad contacting the source electrode and the Schottky electrode; and
a second pad contacting the drain electrode.

15. The HEMT of claim 14, wherein the first pad further includes a field plate over the Schottky electrode.

16. The HEMT of claim 14, further comprising:
a passivation layer between the gate electrode and the first pad.

17. The HEMT of claim 1, wherein
the channel supply layer includes a first thickness between a lowermost surface of the Schottky electrode and an uppermost surface of the channel layer,
the channel supply layer includes a second thickness between an uppermost surface of the channel supply layer and a bottommost surface of the channel supply layer,
the second thickness is greater than the first thickness,
a bottommost surface of the gate electrode is separated from the uppermost surface of the channel layer by a first distance, and
a value of the first distance is different than a value of the first thickness.

18. The HEMT of claim 6, wherein
a bottommost surface of the first electrode layer is directly on an uppermost surface of the channel supply layer, and
a bottommost surface of the second electrode layer is on an upper surface of the channel supply layer at the bottom of the Schottky electrode accommodation unit.

19. The HEMT of claim 1, further comprising at least one of wherein
a first pad contacting the source electrode and the Schottky electrode; and
a second pad contacting the drain electrode, wherein
the first thickness of the channel supply layer is 6 nm and the second thickness of the channel supply layer is 25 nm.

20. A high electron mobility transistor (HEMT) comprising:
a channel layer;
a channel supply layer on the channel layer,
an upper surface of the channel supply layer defining a Schottky electrode accommodation unit;
a source electrode and a drain electrode on at least one of the channel layer and the channel supply layer;
a gate electrode between the source electrode and the drain electrode such that the Schottky electrode accommodation unit of the channel supply layer is between the gate electrode and the drain electrode; and
at least part of a Schottky electrode in the Schottky electrode accommodation unit of the channel supply layer,
the Schottky electrode forming a Schottky contact with the channel supply layer, and
the Schottky electrode is electrically connected to the source electrode,
the Schottky electrode accommodation unit is a recess defined by the upper surface of the channel supply layer and separated from an interface between the channel layer and the channel supply layer,
a distance from a bottom portion of the Schottky electrode accommodation unit to the interface between the channel layer and the channel supply layer is maintained in a range from 6 nm to 25 nm such that a level at which a concentration of a two-dimensional electron gas (2DEG) formed in the channel layer below the Schottky electrode is equal or greater than about 90% of a concentration of the 2DEG formed in an adjacent region of the channel layer and less than about 100% of a concentration of the 2DEG formed in an adjacent region of the channel layer, when a voltage is not applied to the Schottky electrode.

21. A method of manufacturing a high electron mobility transistor (HEMT), the method comprising:
forming a channel layer;
forming a channel supply layer on the channel layer;
forming a Schottky electrode accommodation unit in the channel supply layer,
the Schottky electrode accommodation unit being a recess defined by an upper surface of the channel supply layer and separated from an interface between the channel layer and the channel supply layer;
forming a source electrode and a drain electrode on at least one of the channel layer and the channel supply layer;
forming a gate electrode between the source electrode and the drain electrode; and
forming at least a part of a Schottky electrode in the Schottky electrode accommodation unit, the Schottky electrode forming a Schottky contact with the channel supply layer; and electrically connecting the Schottky electrode to the source electrode, wherein a distance from a bottom portion of the Schottky electrode accommodation unit to the interface between the channel layer and the channel supply layer is maintained at a level at which a concentration of a two-dimensional electron gas (2DEG) formed in the channel layer below the Schottky electrode is equal or greater than about 90% of a concentration of the 2DEG formed in an adjacent region of the channel layer and less than about 100% of a concentration of the 2DEG formed in the adjacent region of the channel layer when a voltage is not applied to the Schottky electrode, the distance from the bottom portion of the Schottky electrode accommodation unit to the interface between the channel layer and the channel supply layer is in a range from a first thickness of the channel supply layer to a second thickness of the channel supply layer, the first thickness of the channel supply layer corresponds to the level at which the concentration of the 2DEG formed in the channel layer below the Schottky electrode is equal to about 90% of the concentration of the 2DEG formed in the adjacent region of the channel layer, the second thickness of the channel supply layer is greater than the first thickness of the channel supply layer and less than a thickness of an other portion of the channel supply layer that is above the adjacent region of the channel layer, and a ratio of the second thickness to the first thickness is about 4.

22. The method of claim 21, wherein the forming the gate electrode includes:

forming a gate electrode accommodation unit in the channel supply layer between the source electrode and the drain electrode,
the gate electrode accommodation unit being defined by the upper surface of the channel supply layer.

23. The method of claim 22, further comprising:
forming an insulating layer on the gate electrode accommodation unit before the forming the gate electrode.

24. The method of claim 21, further comprising:
forming a depletion forming layer on the channel supply layer before the forming the gate electrode.

25. The method of claim 21, further comprising:
forming a first pad contacting the source electrode and the Schottky electrode; and
forming a second pad contacting the drain electrode.

26. The method of claim 25, wherein the first pad includes a field plate over the Schottky electrode.

* * * * *